United States Patent [19]
Tanaka et al.

[11] Patent Number: 5,895,965
[45] Date of Patent: Apr. 20, 1999

[54] SEMICONDUCTOR DEVICE

[75] Inventors: Naotaka Tanaka, Ibaraki-ken; Makoto Kitano, Tsuchiura; Akihiro Yaguchi, Ibaraki-ken; Ichiro Anjoh, Koganei; Hideki Tanaka, Sagamihara; Asao Nishimura, Kokubunji, all of Japan

[73] Assignee: Hitachi, Ltd., Tokyo, Japan

[21] Appl. No.: 08/933,056

[22] Filed: Sep. 18, 1997

[30] Foreign Application Priority Data

Sep. 20, 1996 [JP] Japan ................................ 8-249739

[51] Int. Cl.[6] .......................................... H01L 23/495
[52] U.S. Cl. .................... 257/668; 257/690; 257/693; 257/737; 257/778
[58] Field of Search ............................ 257/697, 693, 257/778, 737, 738, 668, 690

[56] References Cited

U.S. PATENT DOCUMENTS 5,216,278  6/1993  Lin et al. .
5,420,460  5/1995  Massingill ............................ 257/693

FOREIGN PATENT DOCUMENTS 5-251502  9/1993  Japan .

*Primary Examiner*—Peter Toby Brown
*Assistant Examiner*—Roy Potter
*Attorney, Agent, or Firm*—Antonelli, Terry, Stout & Kraus, LLP

[57] ABSTRACT

In order to provide a semiconductor device of high reliability which suppresses a degradation of the fatigue strength of solder connection portions and warping of a tape-type wiring substrate forming the cause of the inferior contact between solder bumps and an external substrate, and a method of manufacturing the semiconductor device, a frame-like member is disposed on the inner peripheral part of the tape-type wiring substrate so as to relax constraint on the thermal deformation of the tape-type semiconductor substrate.

3 Claims, 5 Drawing Sheets

SEMICONDUCTOR DEVICE

BACKGROUND OF THE INVENTION

The present invention relates to a semiconductor device wherein wiring patterns to be electrically connected to the electrodes of a semiconductor chip or element are formed on a soft insulating substrate, and wherein external terminals made of solder bumps are connected to the wiring patterns.

In the future, it will be a requirement to increase the packaging densities of semiconductor crevices, to reduce the sizes thereof and to curtail the costs of their manufacture more and more. As a technique for coping with an increase in the number of external connection terminals attendant upon a higher packaging density of a semiconductor device, a semiconductor device having a ball grid array (hereinbelow, termed "BGA"), wherein a semiconductor chip is mounted on the front surface of a printed-wiring substrate and wherein metal bumps are arranged on the rear surface of the printed-wiring substrate, is disclosed in, for example, U.S. Pat. No. 5,216,278 (hereinbelow, referred to as "prior-art technique #1").

On the other hand, as a technique for attaining a reduced size and enhanced productivity of a semiconductor device, a tape carrier semiconductor device package (hereinbelow, termed "TCP"), wherein wiring patterns to be electrically connected to the electrodes of each semiconductor chip are formed on an insulating film and wherein the semiconductor chip is arranged in an opening formed in the insulating film, is disclosed in, for example, the official gazette of Japanese Patent Application Laid-open No. 251502/1993 (hereinbelow, referred to as "prior-art technique #2").

The prior-art technique #1 is effective as a technique which can cope with the increased number of external terminals ascribable to the higher packaging density, without enlarging the size of the semiconductor device. However, the productivity of this technique is not high, which forms a hindrance to the curtailment of the cost of manufacture of the semiconductor device.

On the other hand, the prior-art technique #2 can form semiconductor devices in succession on a long and narrow insulating film, and this technique is therefore capable of reducing the size of each semiconductor crevice and of curtailing the cost of manufacture thereof. Since, however, external terminals can be arranged only on the outer peripheral parts of the insulating film, this technique cannot be adopted for a semiconductor chip which has a large number of external terminals.

The inventors have therefore studied ways to simultaneously achieve a heightened packaging density, a reduced size and a curtailed cost of manufacture of a semiconductor device by replacing the printed-wiring substrate of the BGA (prior-art technique #1) with the insulating film (hereinbelow, termed "tape-type wiring substrate") of the TCP (prior-art technique #2).

In this regard, in the case where a semiconductor device was fabricated by replacing the printed-wiring substrate of the BGA with the tape-type wiring substrate of the TCP, both the degradation of the fatigue strength of solder connection portions, which were no serious problem in the BGA, and the warp of the tape-type wiring substrate, which were no serious problem in the TCP, appeared when the semiconductor device was mounted on an external substrate.

In general, the degradation of the fatigue strength of the solder connection portions shortens the lifetime of a semiconductor device, and the warp of a tape incurs inferior contact between solder bumps and an external substrate. Therefore, the reliability of semiconductor device fabricated in this way is very low.

An object of the present invention is to provide a semiconductor device of high reliability which suppresses the degradation of the fatigue strength of solder connection portions and the warp of a tape-type wiring substrate forming the cause of the inferior contact between solder bumps and an external substrate, and a method of manufacturing such a semiconductor device.

The inventors eagerly inquired into causes of a warp of a tape-type wiring substrate and degradation of the fatigue strength of solder connection portions when a semiconductor device employing the tape-type wiring substrate (hereinbelow, this device shall be termed a "tape-type BGA") was mounted on an external substrate. From this, it has been found that the cause is heating during the mounting operation.

Now, the mechanics which result in these drawbacks will be explained with reference to FIGS. 10 and 11. FIG. 10 is a sectional view showing the state in which a tape-type BGA in the prior art is mounted on an external substrate, while FIG. 11 is a model diagram for elucidating the mechanics which result in the warp of the tape-type wiring substrate of the tape-type BGA in the prior art. [Fatigue fracture of Solder connection portions]

In case of mounting the tape-type BGA on the external substrate 8, as illustrated in FIG. 10, the BGA is tentatively fastened at a predetermined position on the external substrate 8, followed by heating the external substrate 8 and the tape-type BGA while they are fastened together. Herein, the solder balls melt due to the heating so as to mount the tape-type BGA on the external substrate 8.

After the mounting is complete, the external substrate 8 and the tape-type BGA are restored to a normal temperature. Since, however, the external substrate 8 and the tape-type BGA have different coefficients of thermal expansion, the magnitudes of their contractions consequently involve a difference, and the difference is directly borne by solder bumps 6 which intervene between the external substrate 8 and the tape-type BGA.

It is assumed by way of example that a soft insulating substrate serving as the basic material of the tape-type wiring substrate 2 is a polyimide tape. In this regard, there are various kinds of polyimide tapes which range from one exhibiting a coefficient of thermal expansion close to that of the external substrate 8, to one exhibiting a considerably smaller coefficient of thermal expansion. Irrespective of the coefficients of thermal expansion, however, the thermal deformation of the tape-type wiring substrate 2 is constrained by a semiconductor chip 1 in the solder connection portions nearest to the semiconductor chip 1, and hence, the difference in thermal expansion of the wiring substrate 2 with respect to the external substrate 8 becomes large, so as to incur the problem of degradation of the fatigue strength of the solder connection portions. Besides, with increase in the number of terminals of the semiconductor device, the size of the semiconductor chip 1 is further enlarged, and so the distance from the outer peripheral part of the semiconductor chip 1 to each of the solder connection portions becomes shorter, so that the burdens to be borne by the solder bumps 6 and the solder connection portions become increasingly heavier.

This phenomenon becomes especially conspicuous because the thermal deformation of the tape-type wiring substrate 2 is constrained by the semiconductor chip 1. It is accordingly advantageous for the solder bumps 6 to replace the sealing resin 4, which seals the inner leads 3 and the circuit surface of the semiconductor chip 1, with a resin of lower elasticity and higher thermal expansion than that in the TCP, so that the constraint of the thermal deformation of the tape-type wiring substrate 2 around the semiconductor chip 1 will be relaxed or relieved. To lower the elasticity of the sealing resin 4, however, signifies to decrease the filler content of the sealing resin 4, so that the moisture resistance of the resin becomes problematic in relation to the protection of the circuit surface of the semiconductor chip 1.

[Warp of Tape-type wiring substrate]

The tape-type wiring substrate 2 is provided substantially centrally with respect to an opening in which the semiconductor device is accommodated. The semiconductor chip 1 is placed in the opening, whereupon the outer peripheral part of the semiconductor chip 1 and that of the opening are joined by the sealing resin 4.

As illustrated in FIG. 11, a difference of thermal deformations appears between the outer peripheral part of the tape-type wiring substrate 2 and the inner peripheral part thereof (i.e., the outer peripheral part of the opening) when the tape-type BGA is heated. The reason therefor is that the thermal deformation of the outer peripheral part of the tape-type wiring substrate 2 is produced in conformity with the coefficient of thermal expansion of this substrate 2 itself, whereas the thermal deformation of the inner peripheral part of the tape-type wiring substrate 2 is constrained by the semiconductor chip 1, because the semiconductor chip 1 is firmly fixed in the opening by the sealing resin 11. In this manner, the tape-type wiring substrate 2 is deformed more at the outer peripheral part thereof than at the inner peripheral part. Consequently, the warp in the vertical direction as viewed in the drawing appears at each outer peripheral corner of the tape-type wiring substrate 2. Further, the quantity of the warp is enlarged by the bimetal effect of the wiring patterns formed on the tape-type wiring substrate 2 or the solder resist (7 in FIG. 10) and a binder or adhesive.

The appearance of the warp of the tape-type wiring substrate 2 signifies that the heights of the solder bumps (6 in FIG. 10) change depending upon the positions thereof. When the magnitude of the change is large, some of the solder bumps fail to come into contact with the external substrate (8 in FIG. 10) in the mounting operation. With an increase in the number of the external terminals, the area of the tape-type wiring substrate 2 becomes larger, and the diameter of each of the solder bumps becomes smaller, so that the allowable value of the warp of the tape-type wiring substrate 2 becomes still smaller.

As thus far explained, it is a major cause for both the degradation of the fatigue strength of the solder bumps and the warp of the tape-type wiring substrate that the thermal deformation of the inner peripheral part of the tape-type wiring substrate is constrained. Accordingly, the object of the present invention can be accomplished by relaxing the constraint of the thermal deformation of the inner peripheral part of the tape-type wiring substrate.

As an expedient for relaxing the constraint of the thermal deformation of the inner peripheral part of the tape-type wiring substrate, according to the present invention, a frame-like member is joined to the inner peripheral part of the surface of the tape-type wiring substrate opposite to the surface thereof formed with the wiring patterns.

FIG. 3 graphically illustrates changes in the quantities of the warp of packages in the cases where tape-type wiring substrates are respectively provided with frame-like members, each having a rectangular section, each being made of copper, and each being formed into an inner shape which is substantially the same as the shape of an opening formed in the tape-type wiring substrate in order to accommodate a semiconductor chip, and into an outer shape whose contour lies at a position corresponding to the outermost peripheries of wiring patterns formed on the tape-type wiring substrate in order to locate solder bumps nearest to the semiconductor chip. The frame-like members mentioned above have heights (hereinbelow, termed "thicknesses") of 0.05 mm, 0.1 mm and 0.2 mm. The figure also illustrates changes in the case where a tape-type wiring substrate is not provided with any frame-like member, and in the case where a tape-type wiring substrate is provided on its whole surface with a frame-like member of copper having a thickness of 0.2 mm. It is understood from the figure that the frame-like member which has a thickness of 0.05 mm is not very effective to prevent warp because of a low rigidity, whereas the frame-like member whose thickness is 0.1–0.2 mm can diminish or relieve the warp. Besides, in the case where the whole surface of the tape-type wiring substrate is covered with a frame-like member having a thickness of 0.2 mm, a warp of large magnitude develops contrariwise due to the bimetal effect of the frame-like member and the tape-type wiring substrate. In order to suppress the warp by providing a frame-like member on the whole surface of a tape-type wiring substrate, the frame-like member must be thickened up to about 2 mm so as to constrain the deformation of the tape-type wiring substrate by virtue of the rigidity of the frame. With such a frame-like member of great thickness, however, it becomes impossible to achieve a thinning of the semiconductor package. Moreover, the weight of a semiconductor device increases, and in some packaged states of the semiconductor device, the solder bumps are burdened with excessive loads and might have their lifetime shortened.

Further, the inventors made a study on the thicknesses of the frame-like members. As a result, it has been revealed that, when the thickness is less than 0.1 mm, the effect of preventing the tape-type wiring substrate from warping cannot be expected due to a low rigidity, so the thickness needs to be at least 0.1 mm. On the other hand, it can be said that the thickness needs to be made at most 2 mm for the purposes of saving space and lightening loads on the solder bumps in the packaged state of the semiconductor device. Also, from the viewpoints of easy availability of material and the enhanced productivity of the frame-like member, it can be said that the thickness should desirably be greater than 0.1 mm and less than 0.3 mm.

Meanwhile, regarding the plane geometries of the frame-like member, like the experimental conditions in FIG. 3, the frame-like member is formed into an inner shape, which is substantially the same as the shape of an opening formed in the tape-type wiring substrate in order to accommodate a semiconductor chip, and into an outer shape, whose contour lies at a position corresponding to the outermost peripheries of wiring patterns formed on the tape-type wiring substrate in order to locate the solder bumps nearest to the semiconductor chip. Thus, the thermal deformations of those parts of the tape-type wiring substrate which lie just over the connection portions of the solder bumps nearest to the semiconductor chip can be caused to follow the thermal deformation of an external substrate. Therefore, the mitigation of the distortions of the solder bumps and the solder connection portions can be attained in addition to the diminution of the warp of the tape-type wiring substrate. By way of example, the plastic strain of lhe solder connection portions nearest to the semiconductor chip can be halved by employing a frame-like member of copper having a thickness of 0.2 mm.

Further, a study was made on the outward sizes of the frame-like members. As indicated in FIG. 3, in the case where a frame-like member having a thickness of 0.2 mm is provided on the whole surface of the tape-type wiring substrate, a warp of large magnitude appears due to the bimetal effect of the frame-like member and the tape-type wiring substrate. In contrast, in a case where the frame-like member is provided on a region which extends up to ⅘ of the full width of the tape-type wiring substrate from the outer peripheral part of the opening of the tape-type wiring substrate, the effect of preventing warp is observed.

This will come from the fact that the elongation magnitude of the frame-like member at the position of ⅘ of the full width of the tape-type wiring substrate from the outer peripheral part of the opening of the tape-type wiring substrate balances with the elongation magnitude of the insulating member itself.

When the outer peripheral part of the frame-like member exceeds ⅘ of the full width of the tape-type wiring substrate, the elongation magnitude of the frame-like member becomes larger than that of the insulating member itself, and hence, warp appears in the tape-type wiring substrate.

Regarding the properties of the frame, the coefficient of linear expansion of the frame should preferably be equal to or greater than the coefficient of linear expansion of the basic material (polyimide rape) of the tape-type wiring substrate and be close lo the coefficient of linear expansion of the external substrate made of glass epoxy. It is therefore effective to employ a copper-based or aluminum-based material. Even in case of employing an organic material such as resin, the material which has a high rigidity and which meets the above conditions of the coefficient of linear expansion is selected.

In a semiconductor device having a semiconductor chip, a soft insulating member, which is formed with wiring patterns on its surface and which is formed with an opening for inserting the semiconductor chip therein, and a sealing resin which seals a surface of the semiconductor chip formed with circuits and joined parts between the semiconductor chip and the insulating member, wherein solder bumps are connected as external terminals to the wiring patterns, the semiconductor device of the present invention is characterized by the following constructions:

(1) A frame-like member is provided on a surface of said insulating member opposite to the surface formed with said wiring patterns.

Polyimide is usually employed as the material of the insulating member. Besides, the wiring patterns are usually made of copper, but they may well be made of gold, silver or aluminum or this material plated with nickel. Regarding the properties of the frame-like member, the coefficient of linear expansion of the frame-like member should preferably be equal to or greater than the coefficient of linear expansion of the basic material (polyimide tape) of the tape-type wiring substrate and be close to the coefficient of linear expansion of an external substrate made of glass epoxy. It is therefore effective to employ a copper-based or aluminum-based material for the frame-like member. Even in case of employing an organic material, such as resin for the frame-like member, a material which has a high rigidity and which has a coefficient of linear expansion equal to or greater than the coefficient of linear expansion of the basic material (polyimide tape) of the tape-type wiring substrate is selected.

Owing to the provision of the frame-like member, it is possible to suppress the warping of the tape-type wiring substrate and to prevent the degradation of the fatigue strength of the solder bumps.

Further, the frame-like member becomes more effective in such a way that the contour of the inner shape thereof is made substantially the same as the outer peripheral part of the opening of the insulating substrate, while the contour of the outer shape thereof is located within the range of positions up to ⅘ of the width of the insulating substrate from a position corresponding to the outermost peripheries of the wiring patterns for depositing the solder bumps nearest to the semiconductor chip, and that the thickness thereof is set within the range of 0.1 mm to 2 mm, inclusive.

Besides, from the viewpoints of easy availability of the material and enhanced productivity of the frame-like member, it can be said that the thickness of the frame-like member should more desirably be greater than 0.1 mm and less than 0.3 mm.

Incidentally, the "width of the insulating substrate" mentioned here designates the distance between one latus of the outer peripheral part of the semiconductor chip and that latus of the outer peripheral part of the tape-type wiring substrate which confronts the former latus.

(2) A sheet of a first frame-like member which is made of the same material as that of said wiring patterns is bonded on a surface of said insulating member opposite to the surface on which said wiring patterns are formed, the first frame-like member being formed into an inner shape thereof which is substantially equal to a shape of the opening of said insulating member, and into an outer shape thereof which is substantially equal to a shape of an outer peripheral part of said insulating member; and a second frame-like member is provided on the sheet, the second frame-like member being formed into an inner shape thereof which is substantially equal to the shape of said opening of said insulating member, and into an outer shape thereof which lies within a range of positions up to ⅘ of a width of said insulating member from a position corresponding to outermost peripheries of said wiring patterns for depositing the solder bumps nearest to said semiconductor chip, a thickness of said second frame-like member being set within a range of 0.1 mm to 2 mm, inclusive.

Owing to this construction, the sheet of the same material as that of the wiring patterns is provided on the whole area of the surface of the tape-type wiring substrate opposite to the surface thereof on which the wiring patterns are formed, so that a warp which is ascribable to the bimetal effect of the wiring substrate and the wiring patterns can be prevented. Furthermore, a warp which is ascribable to the difference between the coefficients of expansions can be diminished by the frame-like member.

Besides, in a case where the first frame-like member and the second frame-like member are unitarily constructed, the number of fabricating steps of the frame-like member increases, but a single bonding operation suffices, so that the productivity of the semiconductor device the time of assembly rises.

(3) The solder bumps are arranged in regions which oppose respective sides of an outer periphery of said semiconductor chip.

Owing to this construction, no solder ball is arranged in any of the regions of corners in which the magnitudes of the warps of the tape-type wiring substrate become the largest during heating during the manufacture of the semiconductor device. Therefore, the connection reliability of a soldering operation is sharply improved.

In a method of manufacturing a semiconductor device having a semiconductor chip, a soft insulating member which is formed with wiring patterns on its surface and which is formed with an opening for inserting the semiconductor chip therein, and a sealing resin which seals a surface of the semiconductor chip on which circuits are formed and joined parts between the semiconductor chip and the insulating member, wherein solder bumps are connected as external terminals to the wiring patterns, and a frame-like member is provided on a surface of the insulating member opposite to the surface on which the wiring patterns are formed, the method of manufacturing a semiconductor device according to the present invention is characterized by:

1) the step of providing an opening in said insulating member, thereafter bonding a sheet for said wiring patterns to said insulating member, and subsequently forming said wiring patterns from the sheet for said wiring patterns;

2) the step of arranging said semiconductor chip in .aid opening of said insulating member, and thereafter laying necessary wiring;

3) the step of using a sealing resin to seal the surface of said semiconductor chip formed with the circuits and the joined parts between said semiconductor chip and said insulating member; and 4) the step of bonding the frame-like member to a desired position of said insulating member.

Owing to these steps, the warp of the tape-type wiring substrate is diminished, and the degradation of the fatigue strength of the solder bumps can be suppressed.

Incidentally, in a case where the step 4) precedes the step 2), the frame-like member can be bonded before the sealing resin adheres around the opening of the tape-type wiring substrate. Therefore, the inner shape of the frame-like member can be made the same as the shape of the opening of the tape-type wiring substrate. Thus, warping of the tape-type wiring substrate can be prevented, and the degradation of the fatigue strength of the solder bumps can be suppressed.

DETAILED DESCRIPTION OF THE PREFERRED EMBODIMENTS

Figure 1:
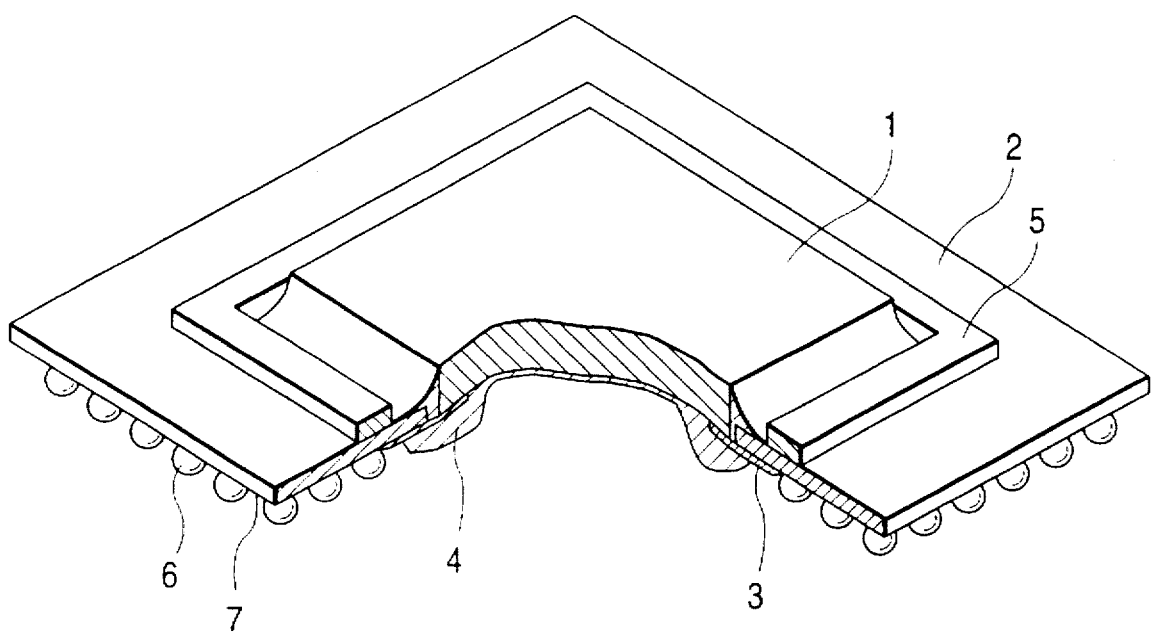
FIG. 1 is a perspective view, partly in section, showing a tape-type BGA according to the first embodiment of the present invention.

Now, various aspects of performance of the present invention will be described with reference to the embodiments shown in the drawings.

Figure 2:
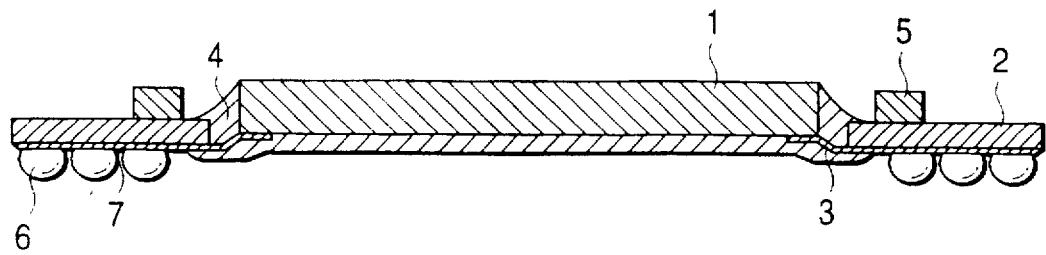
FIG. 2 is a sectional view of the tape-type BGA shown in FIG. 1.
Figure 3:
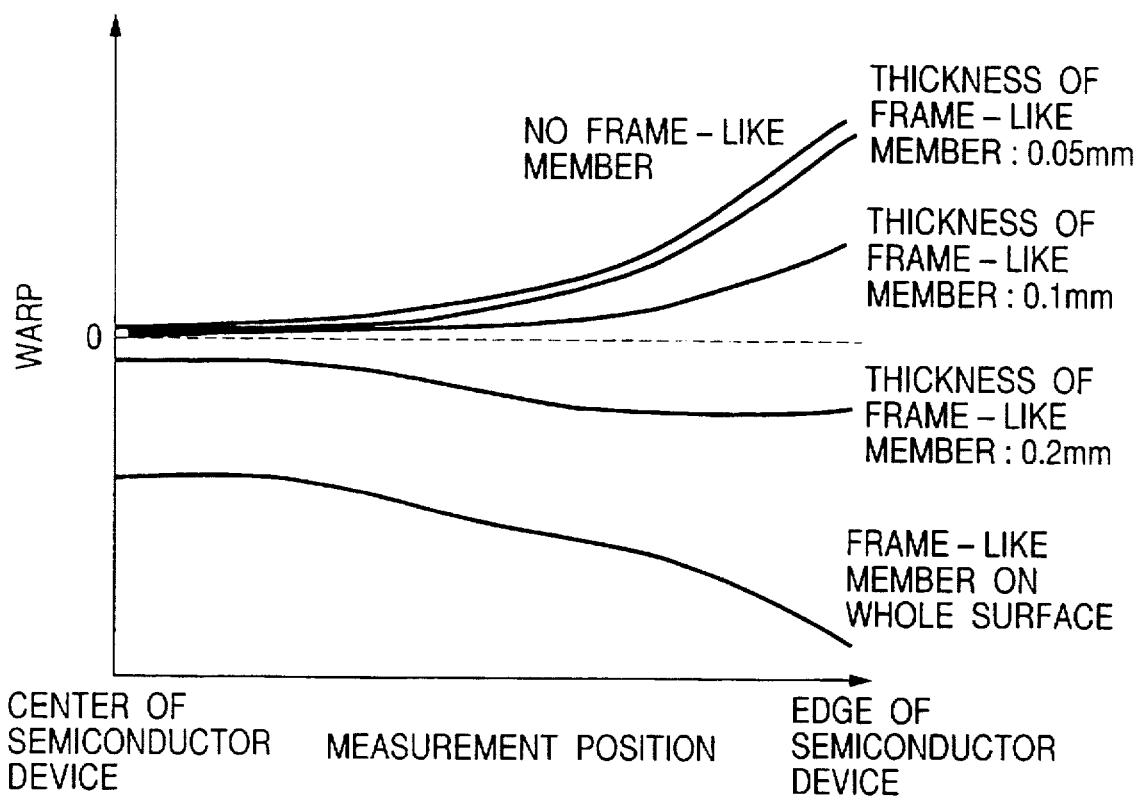
FIG. 3 is a graph showing the correlation between the thickness and the quantity of warp of each of a plurality of tape-type wiring substrates.
Figure 4:
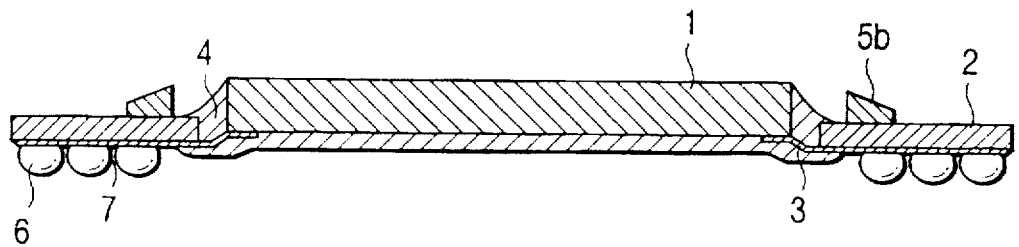
FIG. 4 is a sectional view of a tape-type representing a modification to the first embodiment of the present invention.

The first embodiment of the present invention will be described in conjunction with FIGS. 1 through 4. FIG. 1 is a perspective view, partly in section, showing a tape-type BGA according to this embodiment; FIG. 2 is a sectional view of the tape-type BGA shown in FIG. 1; FIG. 3 is a graph showing the correlation between the thickness and the quantity of warp of each of various tape-type wiring substrates; and FIG. 4 is a sectional view of a tape-type BGA representing a modification to this embodiment.

First, the typical steps of a process for manufacturing the tape-type BGA will be explained. Incidentally, the method is a typical example, and any other method may be used for the manufacture as long as the construction of the present invention can be finally realized.

(1) An opening for inserting a semiconductor chip 1 herein is provided substantially centrally of a polyimide tape.

(2) A copper foil is bonded to the polyimide tape 2 by the use of a binder or adhesive, and it is processed by etching or the like, thereby to form wiring patterns and inner leads 3. By the way, in order to prevent leakage between the wiring patterns formed, the surfaces of the wiring patterns, except for the soldering surfaces (solder pad surfaces), should desirably be coated with a solder resist 7 so as to effect electrical insulation.

Although the wiring patterns are formed of copper foil in this embodiment, they may well be made of a material such as gold, silver or aluminum or a material plated with nickel.

(3) The surface of the semiconductor chip 1 opposite to the surface thereof formed with circuits is fixed by suction or the like, and the tape-type wiring substrate is set so that the semiconductor chip 1 may be disposed centrally of the opening in the tape-type wiring substrate.

(4) The inner leads 3 are bonded onto gold bumps formed on electrodes at the peripheral part of the semiconductor chip 1, by TAB (Tape Automated Bonding). Herein, it suffices that the semiconductor chip 1 and the inner leads 3 are reliably connected. By way of example, accordingly, the inner leads 3 made of a copper foil plated with Ni (nickel) or Au (gold) may well be bonded onto the aluminum electrodes of the semiconductor chip 1 one by one in a single-point fashion.

(5) In order to ensure the moisture resistance of the BGA and to hold the reliability of the inner leads 3, the circuit surface of the semiconductor chip 1 and that interstice between the opening of the insulating member 2 and the outer peripheral part of the semiconductor chip 1 in which the inner leads 3 exist are sealed by a liquid resin 4 of the epoxy type. Incidentally, the sealing resin 4 has a more excellent moisture resistance as the filler content thereof is higher. It is therefore recommended to employ a liquid resin which, at least, contains a filler.

In an example, a frame-like member 5 according to the present invention was joined to the surface opposite to the circuit surface of the tape-type BGA manufactured as indicated above. By using the frame member 5, it was possible to prevent the warping of the tape-type substrate 2 and the degradation of the fatigue strength of solder bumps 6.

The frame-like member 5 employed in the example of this embodiment had an inner shape which was substantially the same as the outer shape of the opening of the tape-type wiring substrate 2, and an outer shape whose contour lay at a position corresponding to the outermost peripheries of the wiring patterns for depositing the solder bumps 6 nearest to the semiconductor chip 1. In addition, the thickness of the frame-like member 5 was 0.2 mm.

As a method of fabricating the frame-like member 5, there is, for example, one wherein a sheet material or a film material, which is employed for lead frames, wiring patterns, etc., is punched or etched into a predetermined shape, or one wherein an organic material, such as a resin, is formed into the predetermined shape by a metal mold.

Besides, the inner shape of the frame-like member 5 should desirably be substantially the same as the shape of the semiconductor chip opening. However, in a case where the sealing resin 4 exists around the semiconductor chip opening, avoiding such a shape is more advantageous from the point of view of the peeling of the frame-like member 5.

In the example of this embodiment, the thickness of the frame-like member 5 was set at 0.2 mm. In this regard, the thickness needs to be at least 0.1 mm from the point of view of rigidity. On the other hand, the thickness needs to be made at most 2 mm for the purposes of saving space and lightening the load on the solder bumps 6 in the packaged state of the semiconductor device. Also, from the viewpoints of the easy availability of the material and the enhanced productivity of the frame-like member 5, the thickness should desirably be greater than 0.1 mm and less than 0.3 mm.

Meanwhile, in this embodiment, the inner shape of the frame-like member 5 is substantially the same as the shape of the opening of the tape-type wiring substrate 2, and the outer circumference has its contour located at the position corresponding to the outermost peripheries of the wiring patterns for depositing the solder bumps 6 nearest to the semiconductor chip 1. Thus, the thermal deformations of those parts of the tape-type wiring substrate 2 which lie just over the connection portions of the solder bumps 6 nearest to the semiconductor chip 1 can be caused to follow the thermal deformation of an external substrate. In the example, therefore, the mitigation of the strain of the solder bumps 6 and the solder connection portions could be attained in addition to the diminution of the warp of the tape-type wiring substrate 2. Further, even when the frame-like member 5 was provided on a region which extended up to $\frac{4}{5}$ of the full width of the tape-type wiring substrate 2 from the outer peripheral part of the opening of the tape-type wiring substrate 2, the effect of preventing warping was observed.

Regarding the properties of the frame-like member 5, the coefficient of linear expansion of this member should preferably be equal to or greater than the coefficient of linear expansion of the basic material (polyimide tape) of the tape-type wiring substrate 2 and be close to the coefficient of linear expansion of the external substrate made of glass epoxy. It is therefore effective to employ a copper-based or aluminum-based material. Even in case of employing an organic material, such as a resin, a material which has a high rigidity and which meets the above conditions of the coefficient of linear expansion is selected.

In addition, the solder bumps 6 are formed in such a way that solder balls prepared beforehand are transferred to predetermined positions by the use of a mask and then heated at a high temperature. Alternatively, they are fabricated by printing a solder paste onto a mask and then heating the printed paste at a high temperature.

FIGS. 1 and 2 illustrate the tape-type BGA in which the sectional shape of the frame-like member 5 in the thickness direction thereof is rectangular, but the invention is not restricted to this shape. By way of example, a frame-like member 5b which has a trapezoidal sectional shape in the thickness direction thereof, as shown in FIG. 4, may well be employed as long as a predetermined rigidity can be ensured.

Next, a second embodiment of the present invention will be described with reference to FIGS. 5 and 6. These figures are sectional views of tape-type BGAs according to this embodiment.

Figure 5:
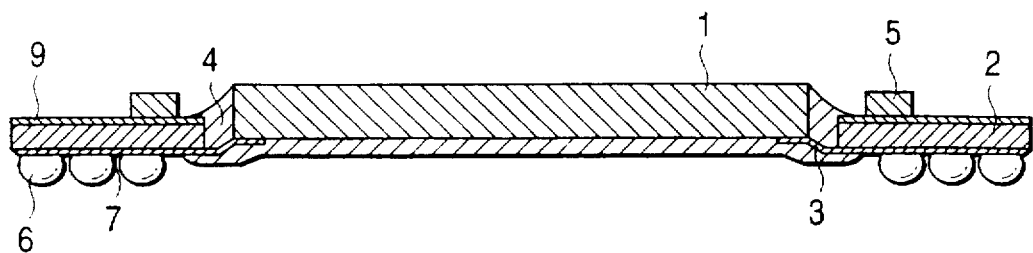
FIG. 5 is a sectional view of a tape-type BGA according to a second embodiment of the present invention.
Figure 6:
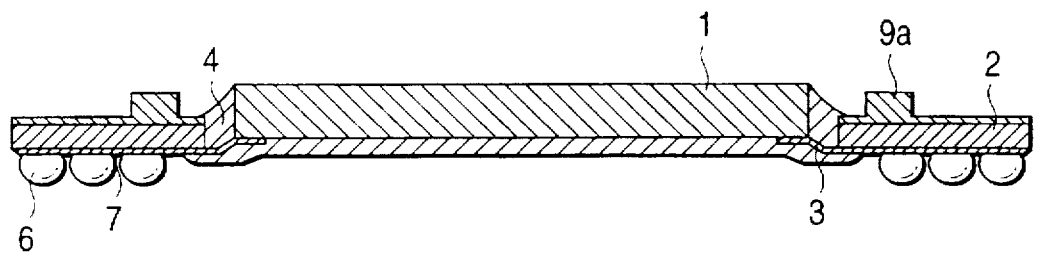
FIG. 6 is a sectional view of a tape-type BGA representing a modification to the second embodiment of the present invention.

In this embodiment, as shown in FIG. 5, a copper foil 9 is joined through a binder or the like onto the surface of a tape-type wiring substrate 2 opposite to the surface on which with wiring patterns are formed. Using the tape-type wiring substrate 2 to which the copper foil 9 is stuck, the semiconductor device is manufactured by a manufacturing method similar to that of the first embodiment. Incidentally, a frame 5 is fixed on the copper foil 9 through a binder or the like.

The warp of the tape-type wiring substrate 2 attributed to the bimetal effect of the substrate 2 itself and the wiring patterns is cancelled by joining the copper foil 9 through the binder or the like onto the surface of the tape-type wiring substrate 2 opposite to the surface thereof on which the wiring patterns are formed. Furthermore, the warp ascribable to the different coefficients of expansion is diminished by the frame 5.

In the example of FIG. 5, the copper foil 9 and the frame-like member 5 are formed by separate components. As shown in FIG. 6, however, the copper foil 9 and the frame 5 may well be unitarily formed of an identical substance in such a way that a copper foil 9a which is partly thickened from the inner side of the unsealed portion of the tape-type wiring substrate 2 to the intermediate outer position thereof is stuck onto the surface opposite to the wiring patterns. In this case, the number of fabricating steps of the frame-like member increases, but a single bonding operation suffices, so that the productivity of the semiconductor device at the assembling stage rises.

Next, a third embodiment of the present invention will be described with reference to FIGS. 7 and 8. These figures are sectional views of tape-type BGAs according to this embodiment.

In this embodiment, the steps of manufacture differ from those of the first embodiment. More specifically, a frame 5 is previously fixed to a tape-type wiring substrate 2 through a binder before inner leads 3 formed on the tape-type wiring substrate 2 are bonded to electrodes on a semiconductor chip 1. The geometries of the frame 5 on this occasion are the same as in the first embodiment. Subsequently, in sealing the circuit surface of the semiconductor chip 1 and the joined parts of the semiconductor chip 1 and the opening of the insulating member 2 with an epoxy type liquid resin 4, a part inside the frame 5 made of metal is also sealed.

Figure 7:
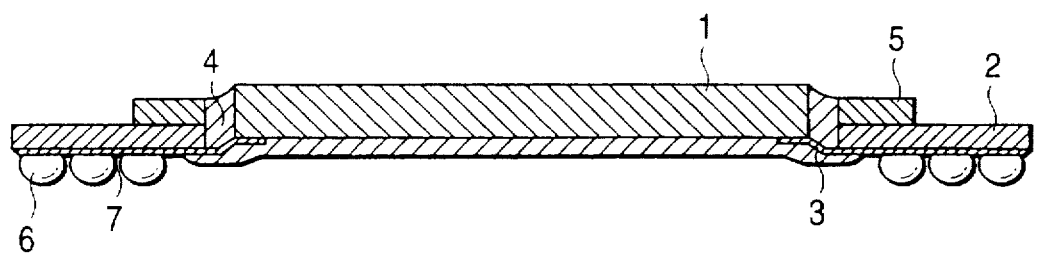
FIG. 7 is a sectional view of a tape-type BGA according to a third embodiment of the present invention.
Figure 8:
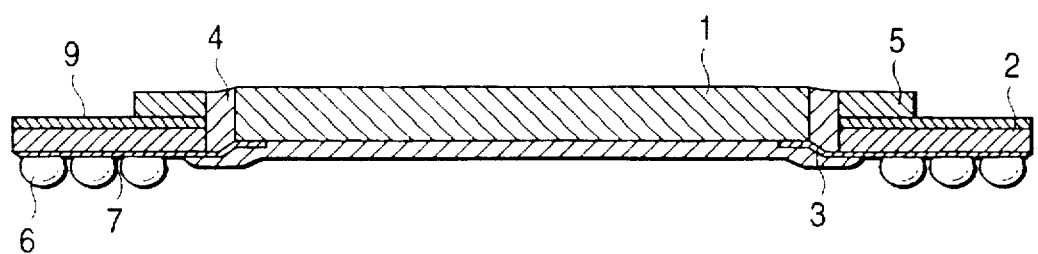
FIG. 8 is a sectional view of a tape-type BGA representing a modification to the third embodiment of the present invention.

Alternatively, as shown in FIG. 7, a frame 5 is previously fixed through a binder to a tape-type wiring substrate 2 to which the copper foil 9 mentioned in the third embodiment is stuck. On the other hand, in the same manner as in the third embodiment, the copper foil 9 and the frame 5 may be unitarily formed beforehand. Subsequently, in sealing the circuit surface of the semiconductor chip 1 and the joined parts of the semiconductor chip 1 and the opening of the insulating member 2 with the epoxy type liquid resin 4, the part inside the frame 5 or the partly thickened copper foil is also sealed.

In this way, the frame-like member 5 can be bonded before the sealing resin 4 adheres around the opening of the tape-type wiring substrate 2. Therefore, the inner shape of the frame-like member 5 can be made the same as the shape of the opening of the tape-type wiring substrate 2, thereby to favorably prevent the warping of the tape-type wiring substrate 2 and suppress the degradation of the fatigue strength of the solder bumps 6.

Figure 9A:
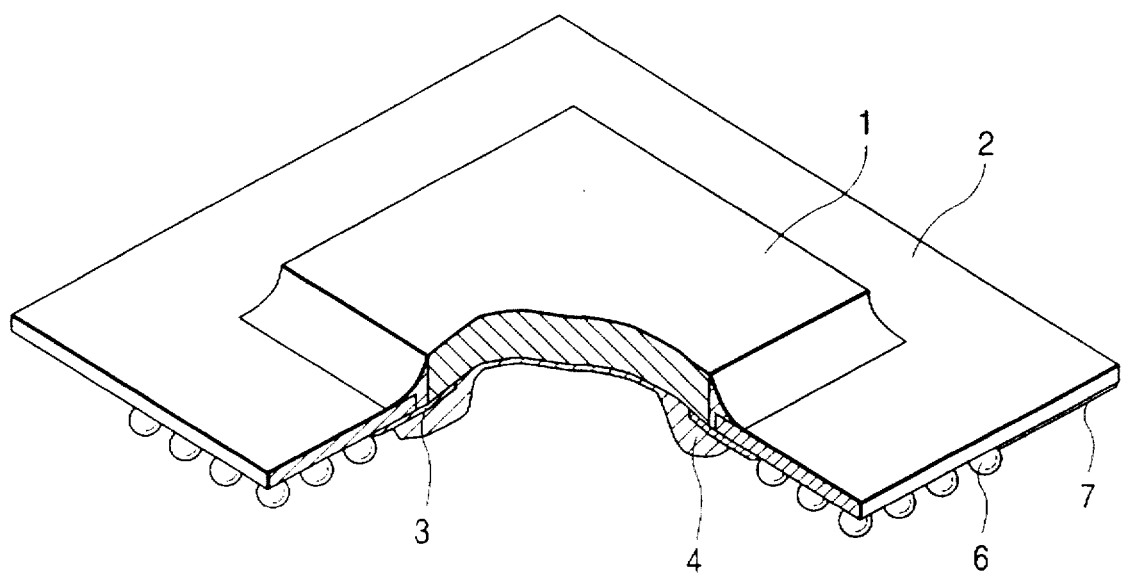
FIG. 9(a) is a perspective view, partly in section, showing a tape-type BGA according to a fourth embodiment of the present invention.

Next, a fourth embodiment of the present invention will be described with reference to FIGS. 9(a) and 9(b). FIG. 9(a) is a perspective view, partly in section, of a tape-type BGA according to this embodiment, while FIG. 9(b) is a plan view showing the surface of the tape-type BGA formed with solder bumps of FIG. 9(a).

As another expedient for preventing inferior contact in a soldering operation, no solder ball may be arranged in the region of each corner at which the warping of a tape-type wiring substrate 2 during heating becomes a maximum. By way of example, in a case where the outer shape of a package is 15 mm-square, where the outer shape of a chip is 8 mm-square and where the pitch of solder balls is 1.0 mm, 144 pins are realized by regularly arranging the solder balls on the whole surface of the tape-type wiring substrate 2. On this occasion, even when four solder balls are removed at each corner of the tape-type wiring substrate 2 where warping is predominant, 128 pins are realized, and decrease in the number of pins can be suppressed to about 10%. When, besides such a pin arrangement, the warping of the tape-type wiring substrate 2 is diminished by providing a frame-like member, the connection reliability of the soldering operation is sharply improved.

Figure 9B:
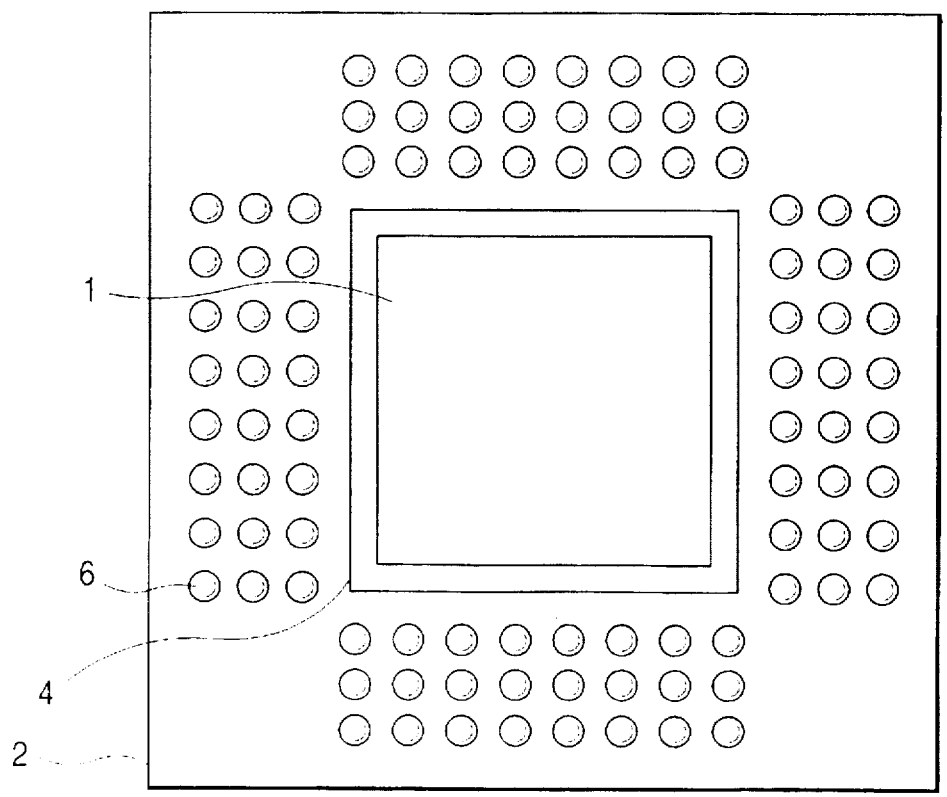
FIG. 9(b) is a bottom view of the fourth embodiment.
Figure 10:
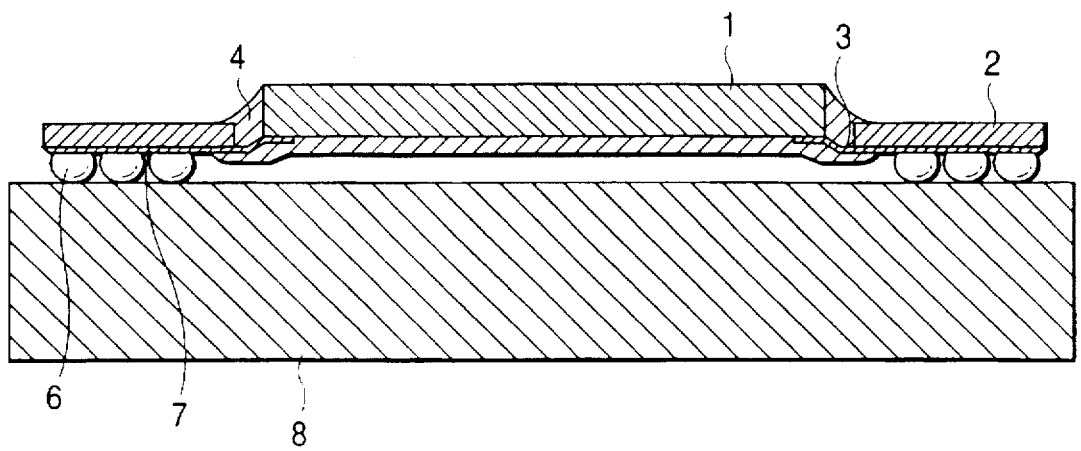
FIG. 10 is a sectional view showing the state in which a tape-type BGA in the prior art is mounted on an external substrate.
Figure 11:
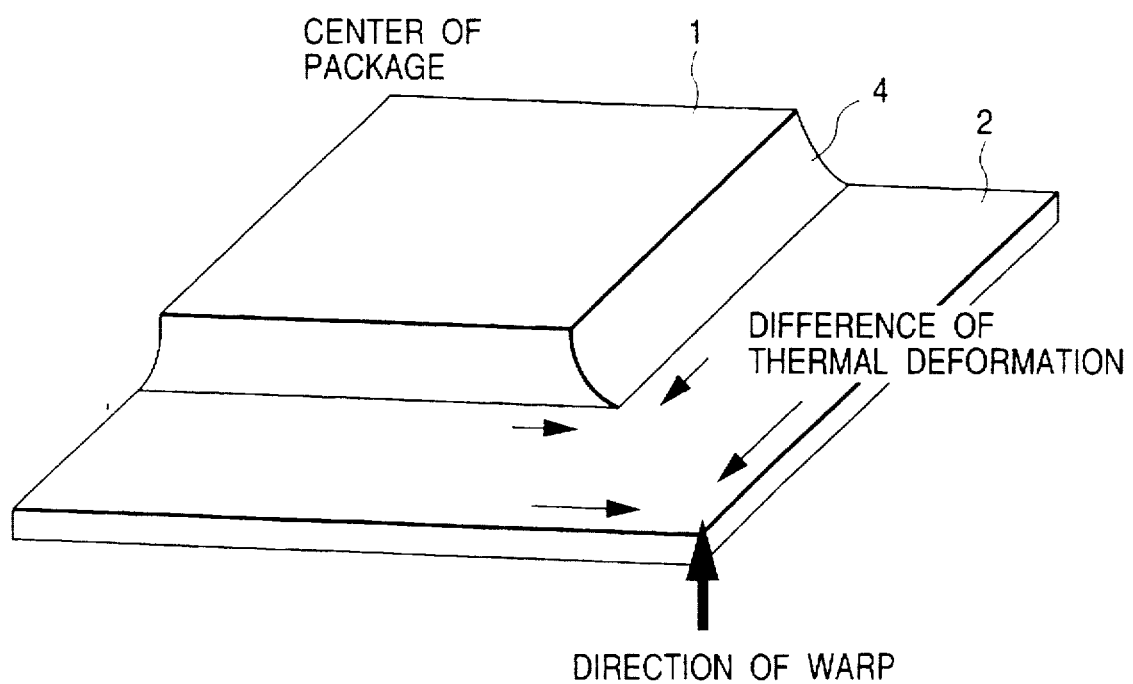
FIG. 11 is a model diagram for explaining the mechanics of the warp of a tape-type wiring substrate included in a tape-type BGA.

In a semiconductor device fabricated by the manufacturing steps indicated in the first embodiment, solder bumps 6 are arranged in regions other than the corners of the tape-type wiring substrate 2 where the warping of this wiring substrate 2 becomes a maximum, as shown in the plan view of FIG. 9(b). When the same frame-like member as in the first embodiment is provided on the tape-type wiring substrate 2, the reliability of the semiconductor device significantly increases.

According to the present invention, it is possible to provide a semiconductor device of high reliability which suppresses the degradation of the fatigue strength of solder connection portions and the warping of a tape-type wiring substrate forming the cause of the inferior contact between solder bumps and an external substrate, and a method of manufacturing the semiconductor device.

What is claimed is:

1. A semiconductor device having a semiconductor chip, a soft insulating member which is formed with wiring patterns on a surface thereof and which is formed with an opening for inserting the semiconductor chip therein, and a sealing resin which seals a surface of the semiconductor chip on which circuits are formed and joined parts between the semiconductor chip and the insulating member, wherein solder bumps are connected as external terminals to the wiring patterns; characterized in that a frame-like member is provided on a surface of said insulating member opposite to the surface on which said wiring patterns are formed, the frame-like member being so formed that the inner shape thereof is substantially equal to the shape of the opening of said insulating member, while the contour of the outer shape thereof lies within a range of positions up to 4/5 of a width of said insulating member from a position corresponding to outermost peripheries of said wiring patterns for depositing the solder bumps nearest to said semiconductor chip, and that the thickness thereof is set within a range of 0.1 mm to 2 mm inclusive.

2. A semiconductor device having a semiconductor chip, a soft insulating member which is formed with wiring patterns on a surface thereof and which is formed with an opening for inserting the semiconductor chip therein, and a sealing resin which seals a surface of the semiconductor chip on which circuits are formed and joined parts between the semiconductor chip and the insulating member, wherein solder bumps are connected as external terminals to the wiring patterns; characterized in that a sheet of a first frame-like member which is made of the same material as that of said wiring patterns is bonded on a surface of said insulating member opposite to the surface on which said wiring patterns are formed, the first frame-like member being so formed that the inner shape thereof is substantially equal to the shape of the opening of said insulating member, and the outer shape thereof is substantially equal to the shape of an outer peripheral part of said insulating member, and that a second frame-like member is provided on the sheet, the second frame-like member being so formed that the inner shape thereof is substantially equal to the shape of said opening of said insulating member, and the outer shape thereof lies within a range of positions up to 4/5 of the width of said insulating member from a position corresponding to outermost peripheries of said wiring patterns for depositing the solder bumps nearest to said semiconductor chip, the thickness of said second frame-like member being set within a range of 0.1 mm to 2 mm inclusive.

3. A semiconductor device having a semiconductor chip, a soft insulating member which is formed with wiring patterns on a surface thereof and which is formed with an opening for inserting the semiconductor chip therein, and a sealing resin which seals a surface of the semiconductor chip on which circuits are formed and joined parts between the semiconductor chip and the insulating member, wherein solder bumps are connected as external terminals to the wiring patterns; characterized in that a frame-like member is provided on a surface of said insulating member opposite to the surface on which said wiring patterns are formed, the frame-like member being formed of a sheet whose inner shape is substantially equal to the shape of the opening of said insulating member and whose outer shape is substantially equal to the shape of an outer peripheral part of said insulating member, the sheet including a portion which has a thickness within a range of 0.1 mm to 2 mm inclusive, the portion has an inner shape whose contour is substantially equal to an outer peripheral part of said opening of said insulating member and an outer shape whose contour lies within a range of positions up to 4/5 of a width of said insulating member from a position corresponding to outermost peripheries of said wiring patterns for depositing the solder bumps nearest to said semiconductor chip.

* * * * *